(12) United States Patent
Kochupurackal et al.

(10) Patent No.: US 8,415,226 B2
(45) Date of Patent: Apr. 9, 2013

(54) PHASE CHANGE MEMORY CELLS AND FABRICATION THEREOF

(75) Inventors: Jinesh B. P. Kochupurackal, Taman Jurong (SG); Robertus A. M. Wolters, Eindhoven (NL); Michael A. A. Zandt, Veldhoven (NL)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/063,782

(22) PCT Filed: Oct. 2, 2009

(86) PCT No.: PCT/IB2009/054313
§ 371 (c)(1),
(2), (4) Date: Aug. 17, 2011

(87) PCT Pub. No.: WO2010/038216
PCT Pub. Date: Apr. 8, 2010

(65) Prior Publication Data
US 2011/0297908 A1 Dec. 8, 2011

(30) Foreign Application Priority Data
Oct. 3, 2008 (EP) .................................. 08105489

(51) Int. Cl.
*H01L 21/20* (2006.01)
(52) U.S. Cl.
USPC ............. 438/382; 438/381; 438/95; 438/102; 257/1
(58) Field of Classification Search .................. 438/382, 438/381, 95, 102; 257/1
See application file for complete search history.

(56) References Cited

U.S. PATENT DOCUMENTS
7,956,358 B2 * 6/2011 Chen .............................. 257/50

* cited by examiner

*Primary Examiner* — Long Pham
(74) *Attorney, Agent, or Firm* — McClure, Qualey & Rodack, LLP (57) ABSTRACT

A phase change memory cell, e.g. a line-cell (2), and fabrication thereof, the cell comprising: two electrodes (6, 8); phase change memory material (10) and a dielectric barrier (12). The dielectric barrier (12) is arranged to provide electron tunnelling, e.g. Fowler-Nordheim tunnelling, to the phase change memory material (10). A contact (15) made of phase change memory material may also be provided. The dielectric barrier (12) is substantially uniform e.g. of substantially uniform thickness, e.g. $\geq 5$ nm.

11 Claims, 14 Drawing Sheets

PHASE CHANGE MEMORY CELLS AND FABRICATION THEREOF

CROSS-REFERENCE TO RELATED APPLICATION

This application is a co-pending application which claims priority to PCT Application No. PCT/IB2009/054313, filed Oct. 2, 2009, entitled "Phase Change Memory Cells and Fabrication Thereof," which claims priority to European Patent Application No. 08105489.2, filed on Oct. 3, 2008 each of these applications being incorporated herein by reference in their entirety.

The present invention relates to phase change memory (PCM) cells and fabrication thereof. The present invention is particularly suited to, but not limited to, PCM line-cells.

Phase change memory (PCM) cells, including PCM line-cells, are known. Very reliable switching of PCM line-cells has been successfully demonstrated. The advantage of the line-cell is that the location of the phase-change is substantially well defined as along the line of cells, closer to the anode (due to the Thomson effect). It is known that the resistance of the cell can be increased by reducing the dimensions of the cell, especially employing thinner films (~5 nm, which are easy to deposit), narrow lines (~25 nm) and longer cells (~100 nm). It is further known to tune the resistance of the cell to integrate the memory with the transistors in integrated circuits.

WO/2006/059313 discloses a non-volatile memory cell comprising a non-uniform tunnel barrier at the beginning of each cell in order to cause resistive heating in the PCM material. This resistive heating approach has a number of disadvantages, such as an increase in power consumption of the device caused by the dissipation of the heat caused by resistive heating.

WO/2006/078505 discloses a non-volatile memory cell comprising a dielectric layer in thermal contact with a layer of PCM material. WO/2006/078505 further discloses applying high voltage across the dielectric layer causing dielectric breakdown to occur, and concentrating thermal energy in a phase-change memory cell. This heating approach has a number of disadvantages, such as permanent damage to the dielectrics caused by dielectric breakdown.

The present inventors have realised that it would be beneficial to increase the resistance of the PCM cell without creating a large increase in power consumption, whilst still providing enough power to set the phase-change in the cell a PCM cell.

The present inventors have further realised it would be desirable to alleviate the problem of quantum effects influencing the amount of current passing through the device due to diminished device dimensions.

The present inventors have also realised that it would be desirable to provide a PCM cell in which dielectric breakdown does not occur, thus increasing reliability of the PCM cell.

The present inventors have further realised that it would be desirable to provide a PCM cell wherein the location at which phase-change occurs can be precisely determined, thereby e.g. removing the unpredictability caused by relying on the Thomson effect (which causes the PCM material to melt closer to the anode), as well as other parameters, such as the grain boundaries of the crystalline material in the cell, and the location of the initial spot that induces a higher resistance (and thus higher temperature).

In a first aspect, the present invention provides a phase change memory cell, comprising a first electrode, a second electrode, phase change memory material between the first electrode and the second electrode, and a dielectric barrier arranged to provide electron tunnelling to the phase change memory material.

In a further aspect, the present invention provides a phase change memory cell according to the first aspect above and such that the first electrode is an anode, the second electrode is a cathode, and the dielectric barrier is arranged to provide electron tunnelling from the cathode.

In a further aspect, the present invention provides a phase change memory cell according to the first aspect above and such that the dielectric layer is positioned such that phase change material is between the dielectric layer and the first electrode, and further phase change material is between the dielectric layer and the second electrode.

In the above aspects, the dielectric barrier may be substantially uniform.

In the above aspects, the dielectric barrier may be of substantially uniform thickness.

In the above aspects, the dielectric barrier may be of thickness ≧5 nm.

In the above aspects, the dielectric barrier may be of a material that exhibits Fowler-Nordheim tunnelling.

In the above aspects, the phase change memory cell may be a phase change memory line-cell.

In a further aspect, the present invention provides a method of fabricating a phase change memory cell, the method comprising the steps of providing a first electrode, providing a second electrode, providing phase change memory material between the first electrode and the second electrode, and providing a dielectric barrier such that electron tunnelling to the phase change material is facilitated.

The first electrode may be an anode, the second electrode may a cathode, and the dielectric barrier may be arranged to provide electron tunnelling from the cathode.

The dielectric layer may be positioned such that further phase change material is between the dielectric layer and the first electrode, and phase change material is between the dielectric layer and the second electrode.

The dielectric barrier may be substantially uniform.

The dielectric barrier may be of substantially uniform thickness.

The dielectric barrier may be of thickness ≧5 nm.

The dielectric barrier may be of a material that exhibits Fowler-Nordheim tunnelling.

The phase change memory cell may be a phase change memory line-cell.

In a further aspect, the present invention provides a method of operating a phase change memory cell comprising a first electrode, a second electrode, and phase change memory material between the first electrode and the second electrode; the method comprising changing the phase of the phase change memory material by electron tunnelling to the phase change memory material.

The first electrode may be an anode, the second electrode may a cathode, and the dielectric barrier may be arranged to provide electron tunnelling from the cathode.

The dielectric layer may be positioned such that phase change material is between the dielectric layer and the first electrode, and further phase change material is between the dielectric layer and the second electrode.

The electron tunnelling may be Fowler-Nordheim tunnelling.

The phase change memory cell may be a phase change memory line-cell.

Embodiments of the present invention will now be described, by way of example, with reference to the accompanying drawings, in which.

Figure 1:
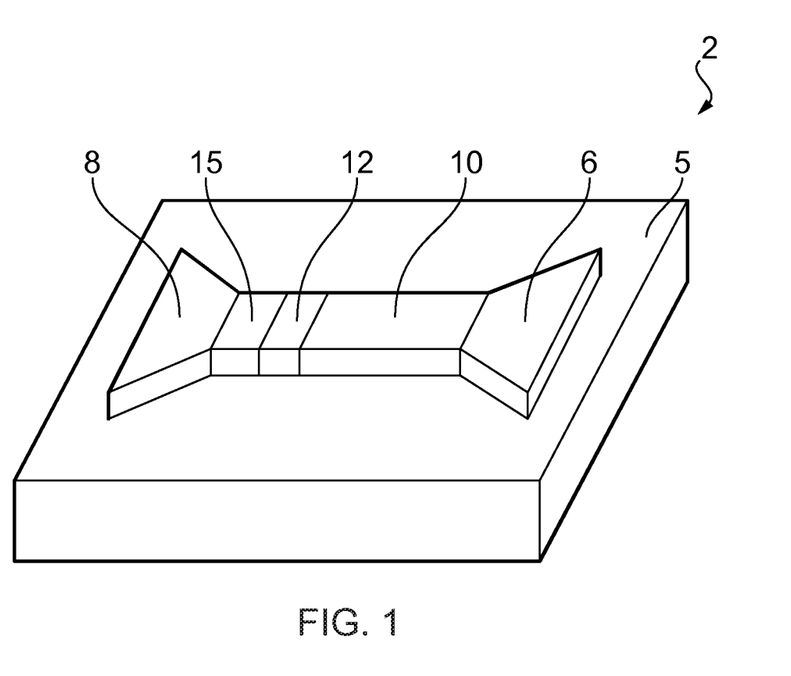
FIG. 1 is a schematic illustration (not to scale) of certain elements of a PCM line-cell.

FIG. 1 is a schematic illustration (not to scale) of certain elements of a PCM cell according to a first embodiment. In this embodiment the PCM cell is a PCM line-cell 2. The PCM line-cell 2 comprises a substrate assembly 5, an anode 6, a cathode 8, a first layer of PCM material 10, a dielectric barrier 12 and a PCM material contact 15 (i.e. a contact made of PCM material).

The substrate assembly 5 comprises a silicon substrate coated with silicon oxide ($SiO_2$).

The anode 6 and the cathode 8 are made from tantalum nitride (TaN).

The dielectric barrier 12 is 2 nm thick and is made from aluminium oxide ($Al_2O_3$).

In overview, the above elements are arranged in sequence as follows: cathode 8—PCM material contact 15—dielectric barrier 12—first layer of PCM material 10—anode 6.

Figure 2:
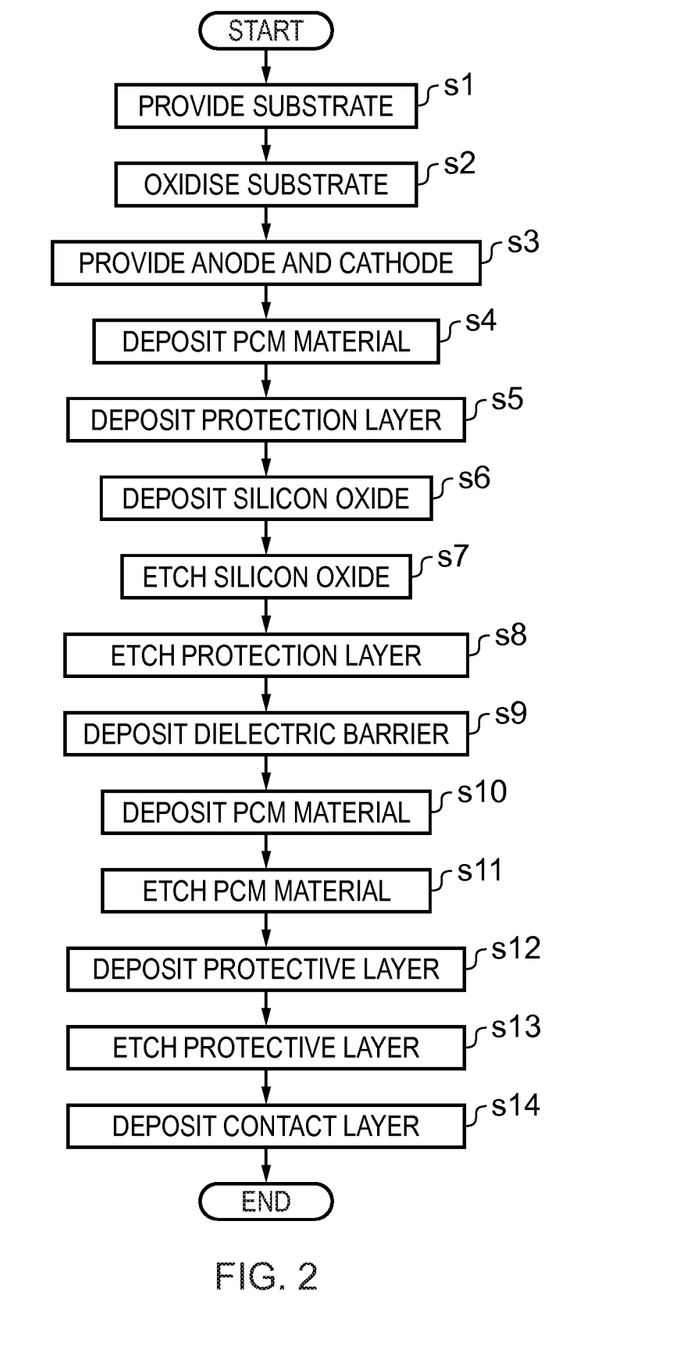
FIG. 2 is a process flow chart showing certain process steps carried out in a fabrication process for fabricating the PCM line-cell of FIG. 1.

FIG. 2 is a process flow chart showing certain process steps carried out in one embodiment of a fabrication process for fabricating the above described PCM line-cell 2. FIGS. 3-12 are schematic cross-sections of the PCM line-cell 2 at various stages of the process of FIG. 2. The same reference numerals as those employed in FIG. 1 have been used to indicate the same elements.

At step s1, a substrate 3 is provided. In this embodiment the substrate 3 is silicon.

Figure 3:
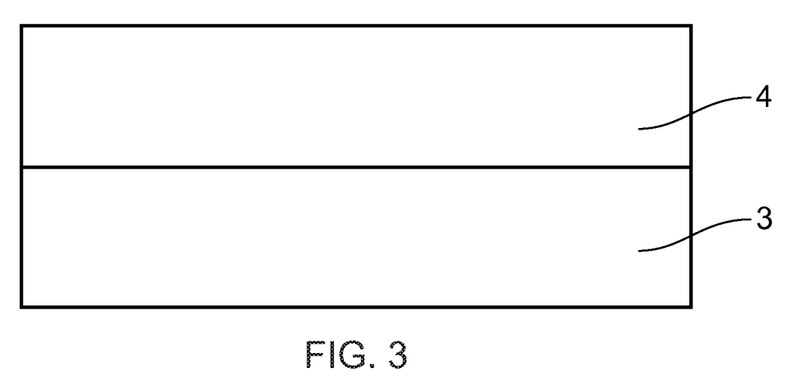
FIGS. 3-12 are schematic cross-sections of the PCM line-cell at various stages of the process of FIG. 2.

At step s2, the substrate 3 is thermally oxidized to cover the substrate 3 with a first layer of silicon oxide ($SiO_2$) 4, as shown in FIG. 3. The substrate 3 and the first silicon oxide layer 4 together correspond to the substrate assembly 5 of FIG. 1.

Figure 4:
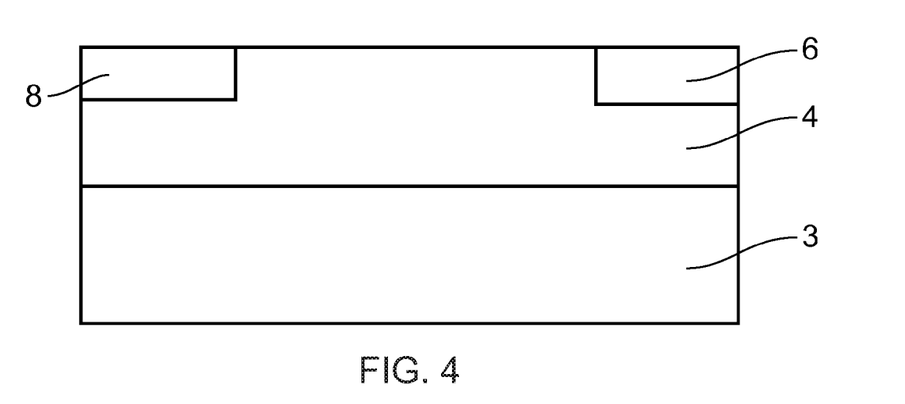

At step s3, the first silicon oxide layer 4 is selectively etched and anode 6 and cathode 8 are deposited on top of the layer of silicon oxide 3. In this embodiment the anode 6 and the cathode 8 are made from tantalum nitride (TaN). The resulting structure is shown in FIG. 4.

At step s4, a first layer of PCM material 10 is deposited so as to extend over a portion of the top of the first silicon oxide layer 4 and over a portion of the anode 6.

Figure 5:
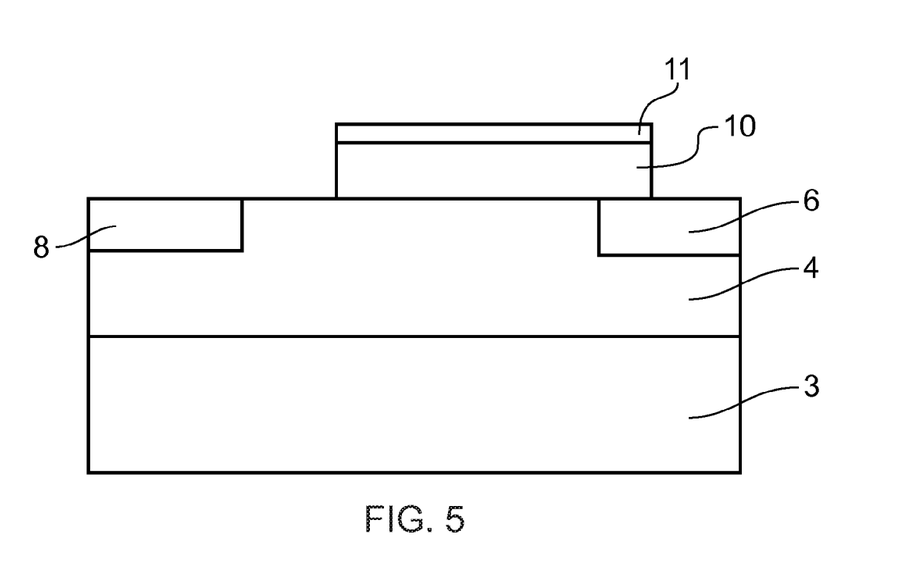

At step s5, a protection layer 11 is deposited on the first layer of PCM material 10. In this embodiment the protection layer 11 is silicon nitride ($Si_3N_4$). The resulting structure is shown in FIG. 5.

Figure 6:
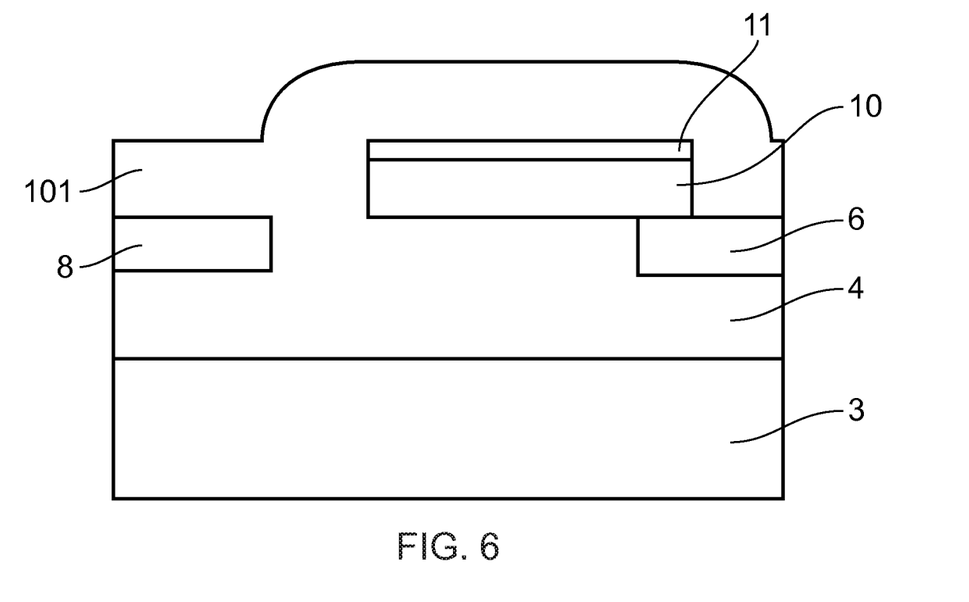

At step s6, a second layer of silicon oxide ($SiO_2$) 101 is deposited on the cathode 8, the first layer of silicon oxide 4, the protection layer 11 and the anode 6. The resulting structure is shown in FIG. 6.

Figure 7:
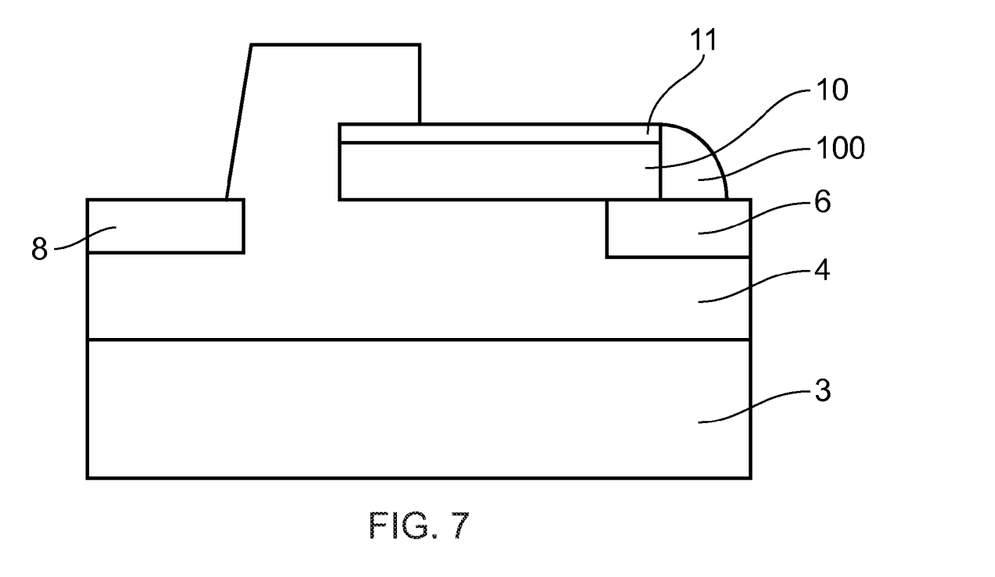

At step s7, the second layer of silicon oxide 101 is selectively etched to remove portions of the second layer of silicon oxide 101 from the top of the protective layer 11, the anode 6, and the cathode 8. The silicon oxide etching forms a spacer 100. The resulting structure is shown in FIG. 7.

At step s8, the protection layer 11 is selectively etched to remove the protection layer 11 from the first layer of PCM material 10.

Figure 8:
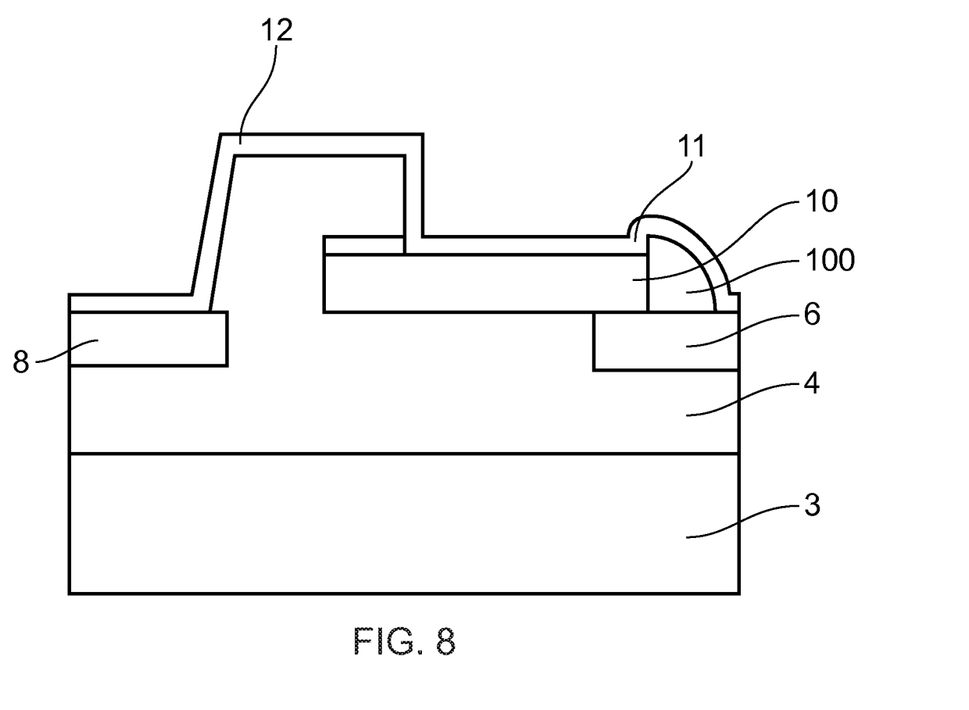

At step s9, a dielectric barrier 12 is deposited on the cathode 8, the remaining exposed second layer of silicon oxide 101 including the spacer 100, the first layer of PCM material 10, and the anode 6. In this embodiment the dielectric barrier 12 is deposited by means of ALD or CVD techniques. In this embodiment the dielectric barrier 12 is 2 nm thick and is made from aluminium oxide ($Al_2O_3$). The resulting structure is shown in FIG. 8.

Figure 9:
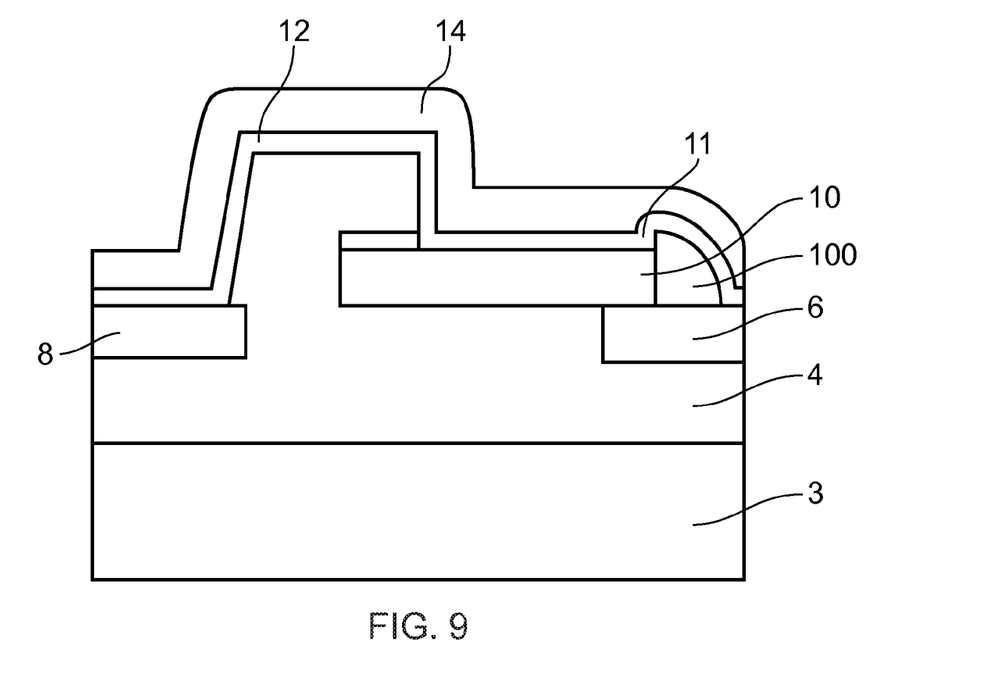

At step s10, a second layer of PCM material 14 is deposited on the dielectric barrier 12. The resulting structure is shown in FIG. 9.

Figure 10:
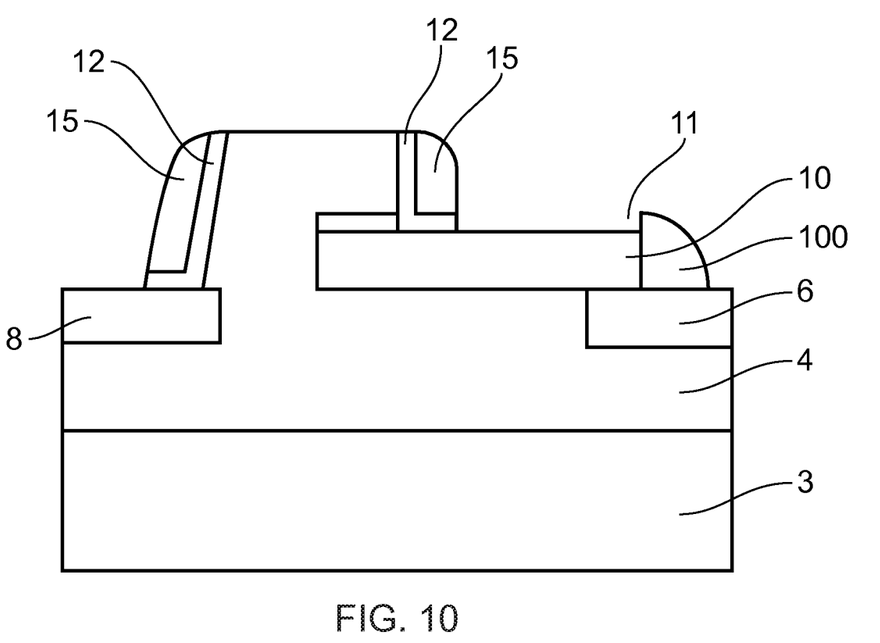

At step s11, the second layer of PCM material 14 is selectively etched. This results in PCM material around the dielectric barrier 12, which acts as a PCM material contact 15 to the dielectric barrier 12. The resulting structure is shown in FIG. 10.

Figure 11:
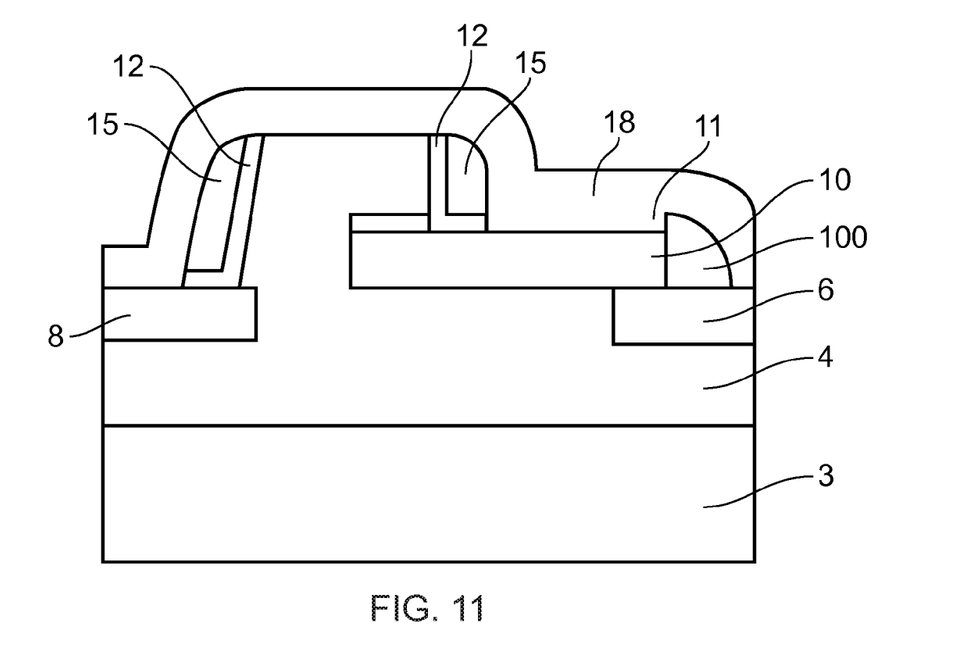

At step s12, a protective layer 18 is deposited on the cathode 8, the dielectric barrier 12, the PCM material contact 15, the first layer of PCM material 10, the first layer of silicon oxide 4 and the anode 6. In this embodiment the protective layer 18 is silicon nitride ($Si_3N_4$). The protective layer 18 has the purpose of protecting the PCM contact 15. The resulting structure is shown in FIG. 11.

At step s13, the protective layer 18 is selectively etched to remove the protective layer 18 from the cathode 8, a portion of the PCM contact 15 and a portion of the dielectric barrier 12.

Figure 12:
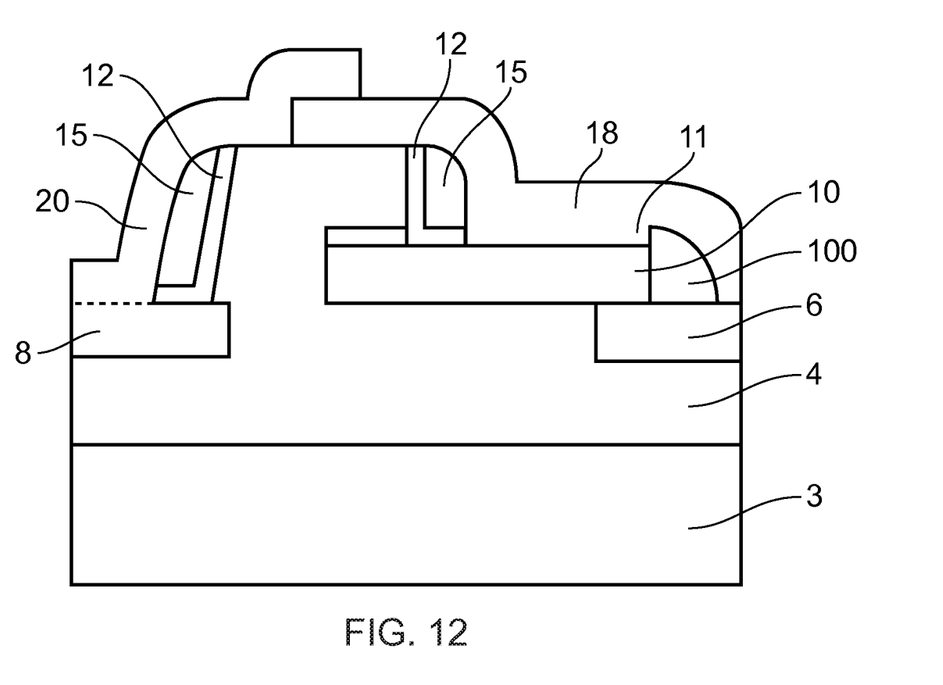

At step s14, a contact layer 20 comprising the same material as the cathode 8 is deposited where the protective layer 18 was removed in step s13. This has the purpose of connecting the cathode 8 with the PCM contact 15 and the dielectric barrier 12. The resulting structure, i.e. the PCM line-cell 2, is shown in FIG. 12.

Figure 13:
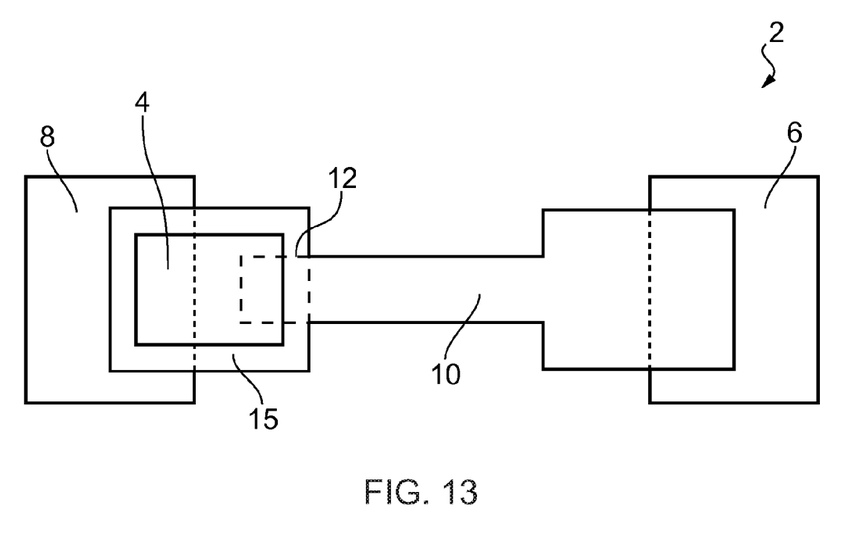
FIG. 13 shows a schematic top view of the PCM line-cell fabricated by the fabrication process of FIGS. 3-12.

FIG. 13 shows a schematic top view of the PCM line-cell 2 fabricated by the above described fabrication process. The same reference numerals as those employed in FIGS. 3-12 have been used to indicate the same elements.

Thus, in this embodiment, a PCM line-cell 2 with a dielectric barrier 12 is provided. The dielectric barrier 12 has the effect of interrupting the free flow of electrons in the PCM line-cell 2. The advantage of the dielectric barrier 12 is that it acts as an energy barrier layer for the electrons and electrons can cross the dielectric layer by quantum mechanical tunnelling.

One advantage of employing tunnelling is that, theoretically, there is no energy consumption due to tunnelling. This is advantageous in that power is saved.

A further advantage of employing tunnelling is that tunnelling is independent of temperature of the medium. This is beneficial in terms of reliability of the device.

The dielectric barrier 12 also acts as a capacitor and induces a capacitance in the cell, but for the set and reset pulses, it does not induce any capacitance at all.

Figure 14:
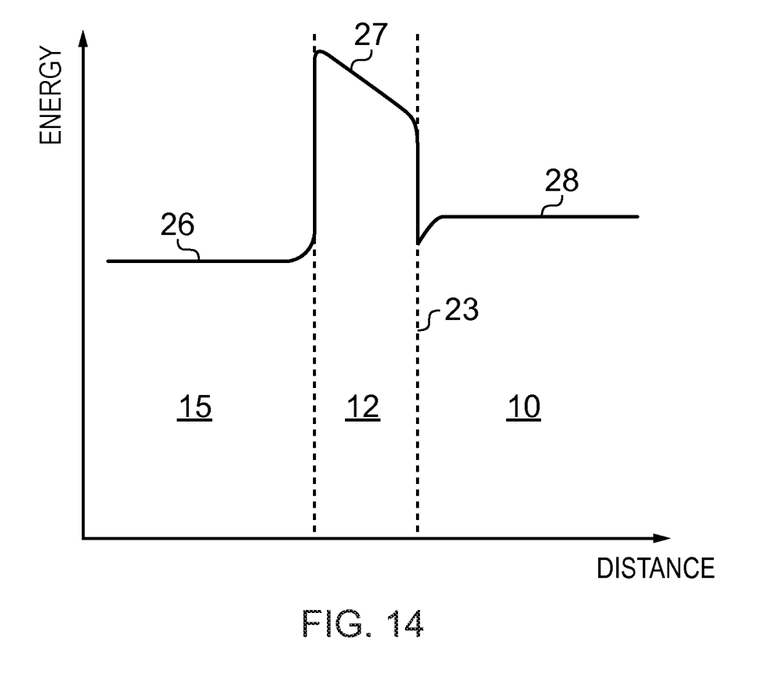
FIG. 14 shows a typical example of an energy diagram for the PCM line-cell.

FIG. 14 shows a typical example of an energy diagram for the PCM line-cell 2 with the dielectric barrier 12 in between the PCM material contact 15 and the first layer of PCM material 10. The energy level 28 of the conduction band edge of the first layer of PCM material 10 is slightly higher than the energy level 26 of the conduction band edge of the PCM material contact 15, but much lower than the energy level 27 of the conduction band edge of the dielectric barrier 12.

Due to the difference of Fermi energy levels of the PCM material contact 15 and the first layer of PCM material 10, even without an applied voltage, there is a slight conduction band bending up for the PCM material contact 15 due to accumulated electrons at the PCM material contact 15. When a voltage is applied across the PCM line-cell 2, the conduction band of the PCM material bends towards the anode 6. This bending is spatially very sharp, since the tunnel barrier is narrow. This makes electrons tunnel through the dielectric barrier 12 easily, but with a higher energy than the conduction band edge of the PCM material contact 15. In this embodiment the dielectric barrier 12 is aluminium oxide ($Al_2O_3$) and thus the tunnelling mechanism is Fowler-Nordheim tunnelling. Quantum mechanical tunnelling is a process where theoretically electrons do not dissipate energy, but they tunnel through the dielectric barrier due to the wavefunction overlap of electrons across the dielectric barrier.

Even though tunnelling is a non-dissipative phenomenon, when the electrons reach the interface 23 between the dielectric barrier 12 and the first layer of PCM material 10, the electrons fall from a higher energy level 27 to the Fermi-level 28 of the first layer of PCM material 10 and release the energy difference at the interface 23 as heat. This heat generates local melting of the first layer of PCM material 10 and initiates melting of the PCM material right at the interface 23 between the dielectric barrier 12 and the first layer of PCM material 10. Thus, regardless of the Thomson effect, with which the amorphous region shifts towards the anode 8, we can amorphize any region on a PCM cell of any geometry.

In order to melt the first layer of PCM material 10, there should be sufficiently high current density passing through the cell. In this embodiment the current density is $\sim 10^7$ $A/cm^2$. Introduction of the dielectric barrier 12 reduces the current through the line, since the tunnelling is based on quantum probabilities. In this embodiment, the dielectric barrier 12 is 2 nm thick, thus there are two components of tunnel current through the dielectric barrier 12. The first component of tunnel current is direct (Ohmic) tunnelling. The second component of tunnel current is Fowler-Nordheim tunnelling. Current density according to these two components is given by:

$$J = CE \exp(-\Delta\phi/kT) + AE^2 \exp(-B/E)$$

The first term is Ohmic tunnelling with $\Delta\phi$ as the defect energy level of the dielectric layer and E is the electric field across the dielectric layer. The second term is Fowler-Nordheim tunnelling with B as a constant given by $B=6.83 \times 10^7 \times \sqrt{m^*}(\Phi)^{3/2}$, where $m^*$ is the effective mass and $\Phi$ is the barrierl height between the dielectric and the electrode/PCM material.

In this embodiment, the dielectric barrier 12 is 2 nm thick, $m^*=0.2\ m_0$, $m_0=9.1\times 10^{-31}$ kg, $\Phi=1$ eV, and T=300K. In this embodiment, $m^*$ is the effective mass of an electron for tunnelling and $m_0$ is the rest mass of an electron. In this embodiment the dielectric layer is silicon oxide ($SiO_2$) thus $\Delta\phi<0.3$ eV and $C=10^9/cm^2$ eV. The calculation with these parameters gives a "minimum" Ohmic current of $$J_{Ohm}=3\times 10^{10} A/cm^2.$$

And, Fowler-Nordheim estimation gives $$J_{FN}=4.3\times 10^5 A/cm^2.$$

Thus in this embodiment the direct tunnelling dominates over the Fowler-Nordheim tunnelling and the combination gives sufficient amount of electrons even for Joule heating.

In this embodiment the coordination number of the atoms in the phase-change cell is 0.4 nm and the cross-section of the PCM line-cell 2 is 5 nm×25 nm and will have around 780 atoms distributed.

In this embodiment the dielectric barrier 12 increases the resistance of the PCM line-cell 2 without significant power consumption. The dielectric barrier 12 selects the energetic electrons that can pass through the barrier and these electrons are energetic enough to initiate phase-change at the barrier-PCM material interface 23. Since the geometry-dependent Joule heating is not the basic cause of the phase-change here, rather the energy of the tunnelling electrons is, the dimensions of the cell are no longer important. This eases the processing since the PCM cell-lines can be thicker. Therefore, this is applicable to the Ovonic concept as well.

In this embodiment, since the resistance of the cell is determined by the resistance of the dielectric barrier 12, the contact resistance of the cathode 8 to the PCM material contact 15 is no longer important because it will be always much less than the resistance of the dielectric barrier 12. This tends to solve the issue that to achieve Joule-heating in the PCM material, the contact resistance of the cathode-PCM interface should be small.

The dielectric barrier 12 induces phase-change at the interface 23 between the dielectric barrier 12 and the first layer of PCM material 10, thus facilitating the precise determination of the melting spot in the PCM line-cell.

The initiation of the phase-change is due to the electrons releasing energy at the interface 23 between the dielectric barrier 12 and the first layer of PCM material 10 rather than Joule-heating, thus the device needs much less power and much smaller current density.

Dielectric breakdown of the dielectric barrier 12 is unlikely to occur, thus the PCM line-cell 2 has greater reliability. In this embodiment the dielectric layer is 2 nm thick silicon oxide, and dielectric breakdown starts at 4V, which is 20 MV/cm across the dielectric layer.

In the above embodiment, the substrate 3 is made of silicon. However, in other embodiments other substrate materials may be used.

In the above embodiment, a silicon oxide layer 4 is deposited on the substrate 3. However, in other embodiments other layers may be deposited directly on to the substrate 3.

In the above embodiment, the protection layers 11, 18 are made from silicon nitride ($Si_3N_4$). However, in other embodiments other arrangements and/or other materials may be used for the protection layers. Depending on circumstances, the protection layers may also be omitted.

In the above embodiment, the anode 6 and the cathode 8 are made from tantalum nitride (TaN). However, in other embodiments other suitable materials, such as titanium nitride (TiN) for example, may be used.

In the above embodiment, the dielectric barrier 12 is made from aluminium oxide ($Al_2O_3$), a material that exhibits the Fowler-Nordheim tunnelling mechanism. However, in other embodiments other suitable materials may be used. For example, other dielectrics that exhibit the Fowler-Nordheim tunnelling mechanism, such as $SiO_2$, $La_2O_3$ etc., may be used. Also, dielectrics with more defect density that exhibit the Poole-Frenkel charge injection, such as $Si_3N_4$, $ZrO_2$, $TiO_2$ etc. may be used. Dielectrics with Poole-Frenkel injection exhibit Arrhenius behaviour in current, which means that the resistance of the dielectric drops exponentially with temperature. Due to this, the local heating at the interface 23 between the dielectric barrier 12 and the first layer of PCM material 10, and the further melting of the first layer of PCM material 10, could cause reduction of the cell resistance, which should be avoided when optimum reliability of cell functionality is desired, in which case dielectric materials that exhibit Fowler-Nordheim tunnelling are preferred for the tunnel junctions. Nevertheless, depending on the circumstances, as mentioned, the Pool-Frenkel charge injection materials may be used in embodiments when suitable.

In the above embodiment, the dielectric barrier 12 is 2 nm thick. However, in other embodiments other suitable thicknesses of dielectrics may be used. For example, dielectrics of thickness 2-3 nm, 3-4 nm, 5 nm, and greater than 5 nm, may be used. For dielectric barriers thicker than 5 nm only Fowler-Nordheim tunnelling happens, thus $10^5$ electrons could melt almost the entire line-cell. The thicker the dielectric layer, the lower the breakdown field of the dielectric layer. Generally speaking, the dielectric barrier (i.e. the dielectric layer) is provided in a form such as to effect tunnelling, e.g. by providing a uniform dielectric layer, or at least a substantially uniform dielectric layer, e.g. a substantially uniformly thick dielectric layer; and/or a dielectric layer of substantially uniform composition.

The resistance of the PCM cell can be tuned according to the thickness and type of dielectric used.

In the above embodiment, the PCM line-cell 2 comprises an anode 6 and a cathode 8. However, in other embodiments a first and second electrode may be used in a more general sense, e.g. with alternating polarity, rather than specifically as always the anode and the cathode respectively.

In the above embodiment, the dielectric barrier 12 is positioned between the first layer of PCM material 10 and the PCM material contact 15. However, in other embodiments, the dielectric barrier 12 is positioned between the first layer of PCM material 10 and the cathode 8, i.e. the PCM material contact 15 may be omitted. In such an embodiment electron tunnelling occurs from the cathode, to the first layer of PCM material 10 through the dielectric barrier 12. In such an embodiment, since there is a dielectric barrier 12 between the cathode 8 and any PCM material, at molten stage, reaction between the electrode material and the PCM material is avoided.

In the above embodiment, the PCM cell is a PCM line-cell. However, in other embodiments other PCM structures, such as the IBM cell with trenches, may be used.

In the above embodiments it will be appreciated that the provided PCM cells have significantly improved resistance characteristics according to the demands of the applications. Also, in addition to the advantages outlined above, since the amorphous region starts forming closer to the dielectric interface, a single line with multiple dielectric interfaces can be used to construct serial arrays of PCM cells.

The invention claimed is:

1. A method of fabricating a phase change memory cell, the method comprising:
   providing a substrate;
   forming a first silicon oxide layer on the substrate;
   forming an anode and a cathode on the first silicon oxide layer;
   forming a first phase change material layer on a portion of the first silicon oxide layer;
   forming a second silicon oxide layer over the first silicon oxide layer and the first phase change material layer;
   selectively etching the second silicon oxide layer;
   forming a dielectric barrier on the cathode, the remaining second silicon oxide layer and the anode;
   forming a second phase change material layer on the dielectric barrier; and
   selectively etching the second phase change material layer to form a phase change material contact around the dielectric barrier.

2. The method of fabricating a phase change memory cell according to claim 1, before forming the second silicon oxide layer, further comprising a first protective layer on the first phase change material layer.

3. The method of fabricating a phase change memory cell according to claim 2, wherein the step of selectively etching the second silicon oxide layer remove portions of the second silicon oxide layer from top of the first protective layer, the anode and the cathode.

4. The method of fabricating a phase change memory cell according to claim 1, further comprising forming a second protective layer on the cathode, the dielectric barrier, the phase change material contact, the first phase change material layer, the first silicon oxide layer and the anode.

5. The method of fabricating a phase change memory cell according to claim 4, further comprising selectively etching the second protective layer.

6. The method of fabricating a phase change memory cell according to claim 1, wherein the dielectric barrier is of thickness $\geq 5$ nm.

7. The method of fabricating a phase change memory cell according to claim 1, wherein the dielectric barrier is of a material that exhibits Fowler-Nordheim tunnelling.

8. The method of fabricating a phase change memory cell according to claim 1, wherein the anode and the cathode comprise tantalum nitride (TaN).

9. The method of fabricating a phase change memory cell according to claim 1, wherein the dielectric barrier comprises aluminum oxide.

10. The method of fabricating a phase change memory cell according to claim 2, wherein the first protective layer comprises silicon nitride.

11. The method of fabricating a phase change memory cell according to claim 4, wherein the second protective layer comprises silicon nitride.

* * * * *